(12) United States Patent
Wojtecki et al.

(10) Patent No.: US 12,387,937 B2
(45) Date of Patent: Aug. 12, 2025

(54) SAM FORMULATIONS AND CLEANING TO PROMOTE QUICK DEPOSITIONS

(71) Applicant: International Business Machines Corporation, Armonk, NY (US)

(72) Inventors: Rudy J. Wojtecki, San Jose, CA (US); Nicholas Anthony Lanzillo, Wynantskill, NY (US); Prasad Bhosale, Albany, NY (US); Son Nguyen, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 548 days.

(21) Appl. No.: 17/542,563

(22) Filed: Dec. 6, 2021

(65) Prior Publication Data

US 2023/0178370 A1    Jun. 8, 2023

(51) Int. Cl.
| | |
|---|---|
| *H01L 21/31* | (2006.01) |
| *H01L 21/02* | (2006.01) |
| *H01L 21/32* | (2006.01) |
| *H01L 21/768* | (2006.01) |
| *B82Y 30/00* | (2011.01) |

(Continued)

(52) U.S. Cl.
CPC ........ *H01L 21/31* (2013.01); *H01L 21/02068* (2013.01); *H01L 21/02301* (2013.01); *H01L 21/02636* (2013.01); *H01L 21/02639* (2013.01); *H01L 21/02642* (2013.01); *H01L 21/32* (2013.01); *H01L 21/76826* (2013.01); *H01L 21/76829* (2013.01); *B82Y 30/00* (2013.01); *B82Y 40/00* (2013.01);

(Continued)

(58) Field of Classification Search
CPC .......... H01L 21/0271; H01L 21/02301; H01L 21/76829; H01L 21/02636; H01L 21/02639; H01L 21/02642; H01L 21/76826; C23C 16/0227; C23C 16/04; C23C 16/56; B82Y 30/00; B82Y 40/00
See application file for complete search history.

(56) References Cited

U.S. PATENT DOCUMENTS

| | | | |
|---|---|---|---|
| 10,782,613 B2 | 9/2020 | Wojecki et al. | |
| 2014/0186544 A1* | 7/2014 | Hua | H01L 21/0217 427/534 |

(Continued)

OTHER PUBLICATIONS

Atanasov, "Inherent Substrate-dependent grown initiation and selective-area atomic layer depostition of TiO2 using "water-free" metal-halide/mertal alkoxide reactants", Journal of Vacuum Science & Technology A, Dec. 24, 2015, 10p.

(Continued)

*Primary Examiner* — Eliseo Ramos Feliciano
*Assistant Examiner* — Brad A Knudson
(74) *Attorney, Agent, or Firm* — Cantor Colburn LLP; L. Jeffrey Kelly

(57) ABSTRACT

Embodiments of the invention provide self-assembled monolayers (SAM) formulations and cleaning to promote quick depositions. A hydrogen-based plasma clean is performed on a structure, the structure including a metal layer and a dielectric layer. A self-assembled monolayers (SAM) solution is dispensed on the structure, the SAM solution including SAMs and a solvent, the SAMs being configured to assemble on the metal layer. The structure is rinsed with a rinse solution including the solvent.

17 Claims, 13 Drawing Sheets

(51) Int. Cl.
  *B82Y 40/00* (2011.01)
  *C23C 16/02* (2006.01)
  *C23C 16/04* (2006.01)
  *C23C 16/56* (2006.01)

(52) U.S. Cl.
  CPC .......... *C23C 16/0227* (2013.01); *C23C 16/04* (2013.01); *C23C 16/56* (2013.01)

(56) References Cited

U.S. PATENT DOCUMENTS

| | | | |
|---|---|---|---|
| 2014/0213016 A1* | 7/2014 | Sheng | H10F 77/48 438/57 |
| 2015/0160558 A1* | 6/2015 | Lo | G03F 7/30 430/464 |
| 2016/0140991 A1* | 5/2016 | Chen | G11B 5/746 428/840 |
| 2018/0366317 A1* | 12/2018 | Ke | H01L 21/0228 |
| 2019/0322812 A1* | 10/2019 | Wojtecki | G03F 7/20 |
| 2020/0020580 A1* | 1/2020 | Lee | H01L 21/0228 |
| 2020/0135544 A1 | 6/2020 | Shobha et al. | |
| 2021/0313228 A1 | 10/2021 | Nguyen et al. | |

OTHER PUBLICATIONS

Farm, "Selective-Area Atomic Layer Deposition Using Poly(methyl methacrylate) Films as Mask Layers", J. Phys. Chem. C 2008, 112, 15791-15795, 5 pages.

Grace Period Disclosure? Wojtecki, "Additive Lithography—Organic Monolayer Patterning Coupled with an Area-Selective Deposition", ACS Appl. Mater. Interfaces 2021, 13, 9081-9090, 10 Pages.

Haider, "Area-Selective Atomic Layer Deposition Using an Inductively Coupled Plasma Polymerized Fluorocarbon Layer: A Case Study for Metal Oxides", J. Phys. Chem. C 2016, 120, 26393-26401, 2016, 9p.

Hashemi, "Self-Correcting Process for High Quality Patterning by Atomic Layer Deposition", ACS NANO, vol. 9 ' No. 9 ' 8710-8717 ' 2015, 8 pages.

Huang, "Area-Selective ALD of TiO2 Nanolines with Electron-Beam Lithography", J. Phys. Chem. C 2014, 118, 23306-23312, 7 pages.

Kalanyan, "Using Hydrogen To Expand the Inherent Substrate Selectivity Window During Tungsten Atomic Layer Deposition", Chem. Mater. 2016, 28, 117-126, 10pages.

Mameli, "Area-Selective Atomic Layer Deposition of SiO2 Using Acetylacetone as a Chemoselective Inhibitor in an ABC-Type Cycle", ACS Nano 2017, 11, 9303-9311, 9 pages.

Mettry, "Extending the compositional diversity of films in area selective atomic layer deposition through chemical functionalities", J. Vac. Sci. Technol. A 37(2), Mar./Apr. 2019, 10 p.

Pattison, "Surface Initiated Polymer Thin Films for the Area Selective Deposition and Etching of Metal Oxides", ACS Nano 2020, 14, 4276-4288, 13p.

Singh, "Area-Selective Atomic Layer Deposition of Metal Oxides on Noble Metals through Catalytic Oxygen Activation", Chem. Mater. 2018, 30, 663-670, 8 pages.

Wojtecki, "Fifteen Nanometer Resolved Patterns in Selective Area Atomic Layer Deposition—Defectivity Reduction by Monolayer Design", ACS Appl. Mater. Interfaces 2018, 10, 38630-38637, 8 pages.

Hashemi et al. "A new resist for area selective atomic and molecular layer deposition on metal-dielectric patterns." The Journal of Physical Chemistry C 118.20 (2014): 10957-10962.

* cited by examiner

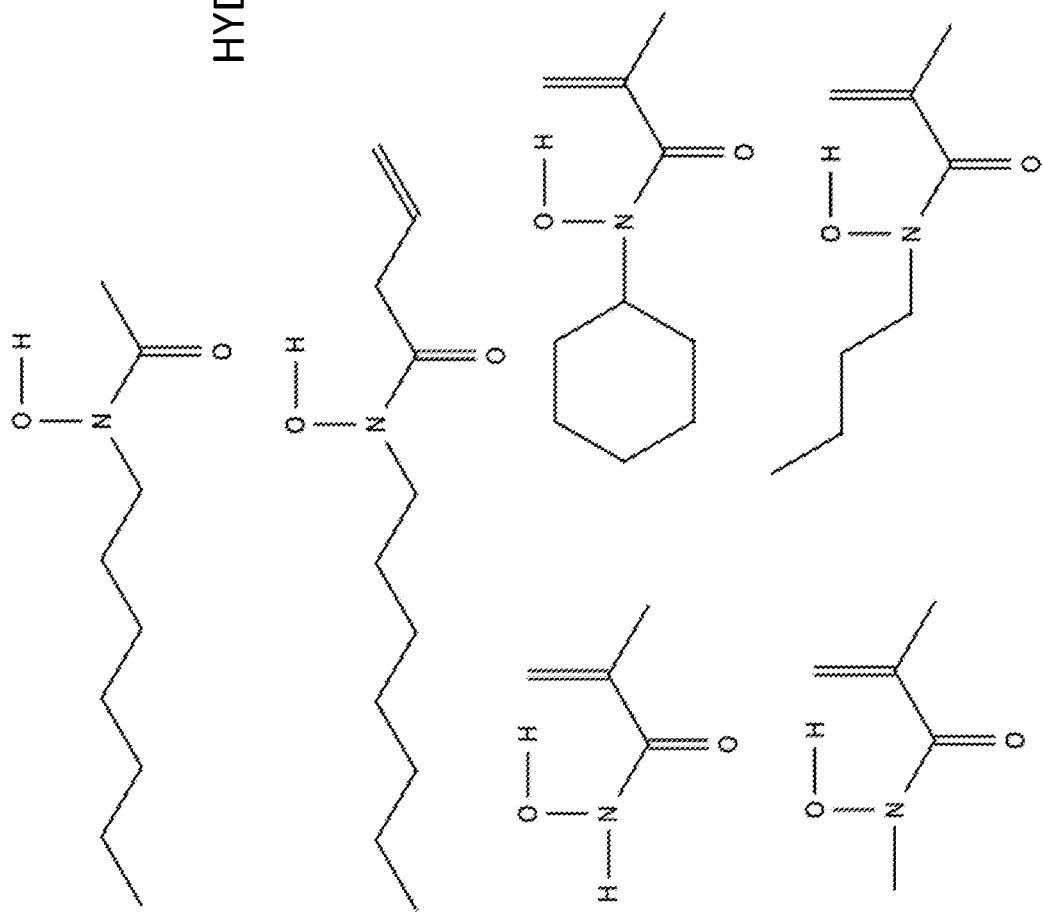

SAM FORMULATIONS AND CLEANING TO PROMOTE QUICK DEPOSITIONS

STATEMENT REGARDING PRIOR DISCLOSURES BY THE INVENTOR OR A JOINT INVENTOR

The following disclosure(s) are submitted under 35 U.S.C. 102(b)(1)(A):

DISCLOSURE(S): Additive Lithography—Organic Monolayer Patterning Coupled with an Area-Selective Deposition, Rudy Wojtecki et. al, published Jan. 20, 2021, ACS Applied Material and Interfaces, pages 9081-9090.

BACKGROUND

The present invention generally relates to fabrication methods and resulting structures for integrated circuits, and more specifically, to fabrication methods and resulting structures configured and arranged to implement self-assembled monolayers (SAM) formulations and cleaning to promote quick depositions.

SAMs of organic molecules are molecular assemblies formed spontaneously on surfaces by adsorption and are organized into large-ordered domains. In some cases, molecules that form the monolayer do not interact strongly with the substrate. This is the case, for instance, of the two-dimensional supramolecular networks of, for example, perylenetetracarboxylic dianhydride (PTCDA) on gold or networks of, for example, porphyrins on highly oriented pyrolitic graphite (HOPG). In other cases, the molecules possess a head group that has a strong affinity to the substrate and anchors the molecule to the substrate. As such, a SAM has a head group, a tail, and a functional end group. Example head groups include thiols, silanes, phosphonates, etc.

SAMs are created by the chemisorption of "head groups" onto a substrate from either the vapor or liquid phase followed by a slow organization of "tail groups." Initially, at a small molecular density on the surface, adsorbate molecules form either a disordered mass of molecules or form an ordered two-dimensional "lying down phase," and at a higher molecular coverage, over a period of time, begin to form three-dimensional crystalline or semicrystalline structures on the substrate surface. The "head groups" assemble together on the substrate while the tail groups assemble far from the substrate. Areas of closely packed molecules nucleate and grow until the surface of the substrate is covered in a single monolayer. Adsorbate molecules adsorb readily because they lower the surface free energy of the substrate and are stable because of the strong chemisorption of the "head groups."

SUMMARY

Embodiments of the present invention are directed to SAM formulations and cleaning to promote quick depositions. A non-limiting example method includes performing a hydrogen-based plasma clean on a structure, where the structure includes a metal layer and a dielectric layer. The method includes dispensing a SAM solution on the structure, wherein the SAM solution includes SAMs and a solvent. The SAMs are configured to assemble on the metal layer. The method includes rinsing the structure with a rinse solution comprising the solvent.

Embodiments of the present invention are directed to a method of forming a structure, where the method includes performing a hydrogen-based plasma clean on the structure including a metal layer and a dielectric layer and puddling a SAM solution on the structure. The SAM solution includes SAMs that assemble on the metal layer and a solvent. The method includes removing the SAMs from the dielectric layer using a rinse solution including the solvent and depositing another dielectric layer on the dielectric layer, where the SAMs inhibit the another dielectric layer from forming on the metal layer. The method includes removing the SAMs from the metal layer.

Other embodiments of the present invention implement features of the above-described methods in structures/devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 13 is a block diagram illustrating example SAM formulations according to one or more embodiments of the invention.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The formation of SAMs using phosphonic, carboxylic, or hydroxamic acids generally require extended periods of time where a film is immersed in a SAM solution for greater than 10 hours. Extended immersion times produce high quality SAMs that can act as barriers for area selective depositions while lower immersion times result in poor quality SAMs that act as poor barriers.

One or more embodiments of the invention are configured to reduce the formation time to produce a high quality SAM film (e.g., from hours or days to minutes) which is beneficial to enable fabrication compatible processes for these SAM materials. According to one or more embodiments of the invention, the formation of good quality SAMs is related to the surface cleaning chemistry and formulation of the SAM component in a solution, as discussed herein. Forming a stable SAM solution is beneficial for NOWPAKs®. NOWPAKs refer to a bottle or container used in track tools to dispense resists in the lithography industry.

One or more embodiments of the present invention provide methods and resulting structures configured and arranged to implement SAM formulations and cleaning to promote quick depositions on structures. According to one or more embodiments of the invention, a method includes performing a surface clean prior to SAM deposition. A SAM formulation includes a high boiling point solvent that makes a stable formulation with no (visually) observed precipitation (e.g., to the naked eye without the assistance of a microscope) and/or nanoscopic particles observed with a microscope. The SAM formulation may contain additives that improve solution stability and/or continue to clean the surface. The SAM deposition method can be applied in a track coating system through a puddle and rinse process without necessarily requiring additional processes.

Figure 1:
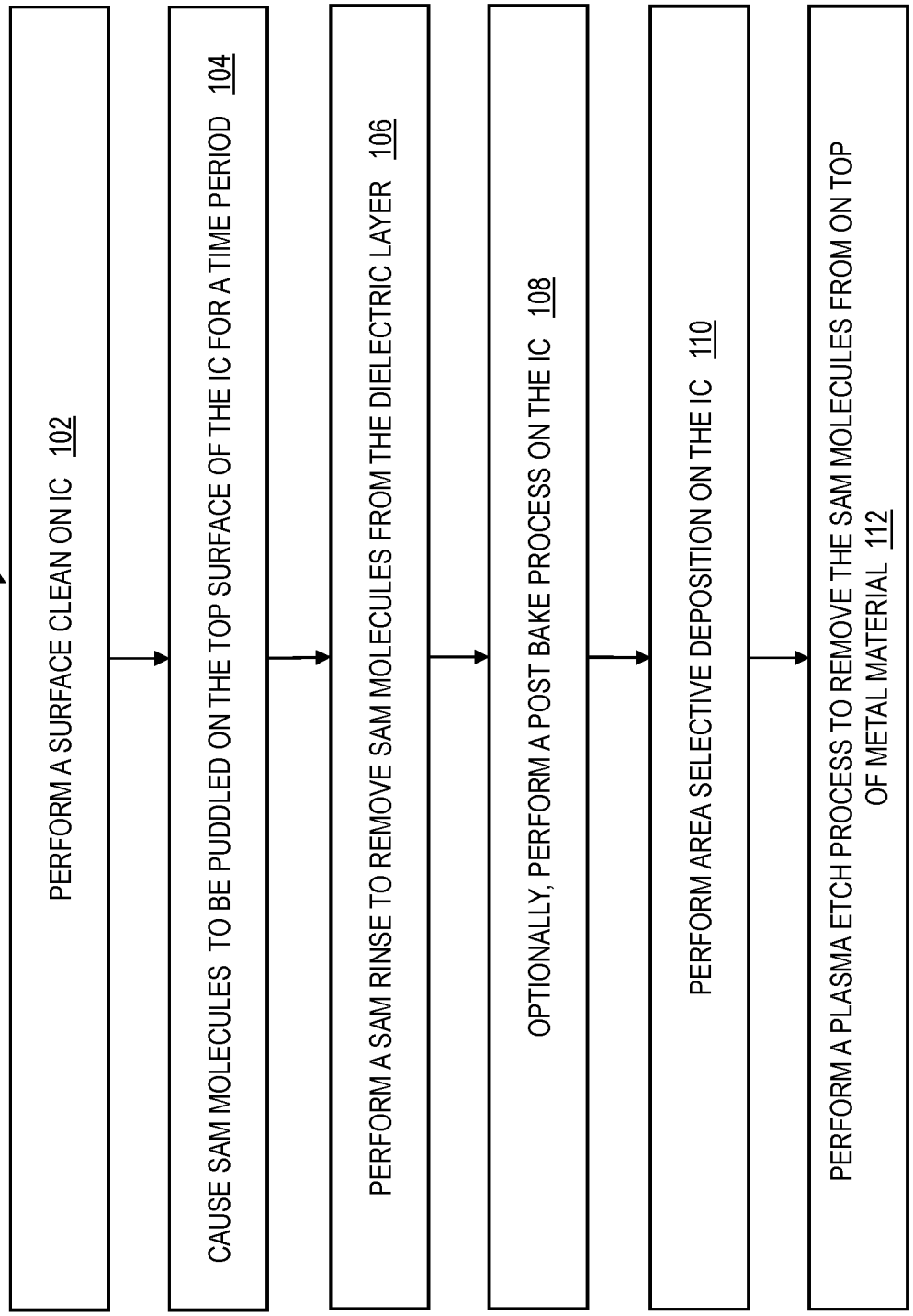
FIG. 1 is a flowchart of a method of implementing SAM formulations and cleaning to promote quick depositions for a structure according to one or more embodiments of the invention.
Figure 2:
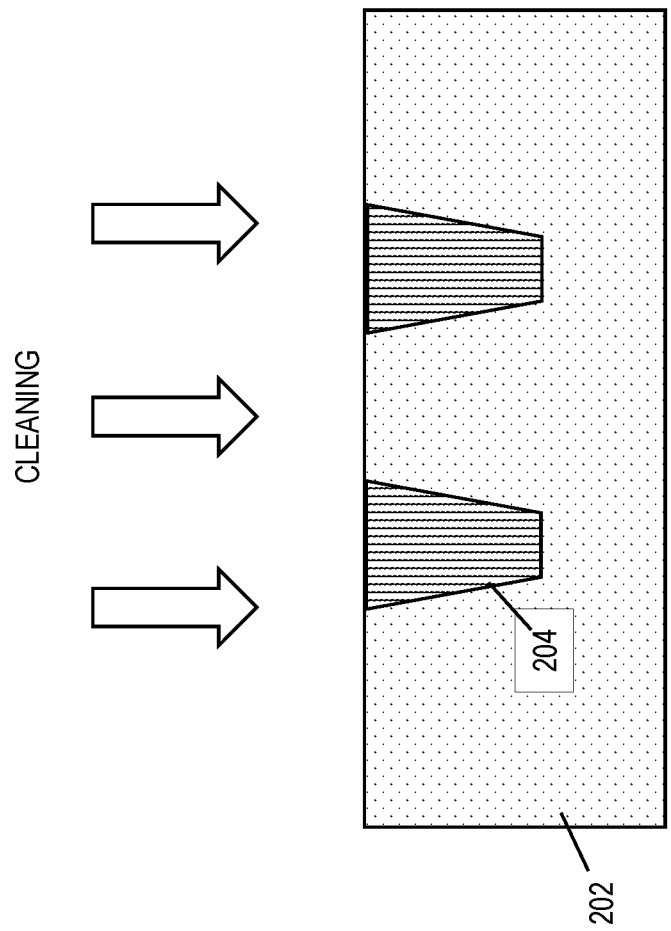
FIG. 2 depicts a cross-sectional view of a portion of an IC under-fabrication after fabrication operations according to one or more embodiments of the invention.

Turning now to a more detailed description of aspects of the present invention, FIG. 1 is a flowchart of a method 100 for SAM formulations and cleaning to promote quick depositions on a structure according to one or more embodiments of the invention. When performing the method 100, reference can be made to FIGS. 2-8, which depict cross-sectional views of a portion of an IC 200 after fabrication operations according to one or more embodiments of the invention. As seen in FIG. 2, the IC 200 has metal material 204 formed in a dielectric layer 202. Metal material 204 may be metal lines, metal vias, wires, pads, etc., formed in dielectric layer 202. Metal material 204 and dielectric layer 202 are coplanar, for example, after chemical mechanical polishing/planarization (CMP) is performed. Atomic force microscope (AFM) inspection is performed on the IC 200. Standard semiconductor fabrication techniques can be utilized to fabricate IC 200 as understood by one of ordinary skill in the art. Moreover, any suitable deposition techniques and etching techniques can be utilized herein.

Metal material 204 can include metals and metal alloys. Examples of the materials for metal material 204 can include copper, aluminum, tungsten, tin, zinc, gold, nickel, titanium nitride, tantalum nitride, ruthenium, platinum, etc. Dielectric layer 202 can include ultra-low-k dielectric materials, low-k materials, etc. Ultra-low-k dielectric materials include dielectric materials having a k value less than 2.5 measured relative to a vacuum. Example ultra-low-k dielectric materials generally include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, tetraethyl orthosilicate or tetraethoxysilane (TEOS), or combinations thereof. The ultra-low-k dielectric material can be produced using a templated process or a sol-gel process as is generally known in the art. Low-k dielectric materials may include materials having a k value greater than 2.5. Low-k dielectric materials may include oxides, nitrides, etc. Example low-k materials may include silicon dioxide, silicon nitride, silicon oxynitride, organosilicate glass (OSG), carbon-doped oxide, etc.

At block 102, the method 100 includes performing a surface clean on IC 200 as depicted in FIG. 2. A hydrogen-based plasma clean is performed on the IC 200. The hydrogen-based plasma can include ammonia, etc. The hydrogen-based plasma clean can be performed for using, for example, downstream remote $H_2$ plasma in a plasma chamber, such as the Applied Materials (AMAT) Chamber D. The power could be about 200 watts (W) but remote so there is little ion bombardment. The time could be about 100-300 milli-Torr (mT) for 2 minutes. In one or more embodiments, a direct plasma can be utilized, for example, with $H_2$ plasma using a radio frequency (rf) power density of <1 W/cm$^2$ (13.56 megahertz (Mhz)) for 30 seconds.

Figure 3:
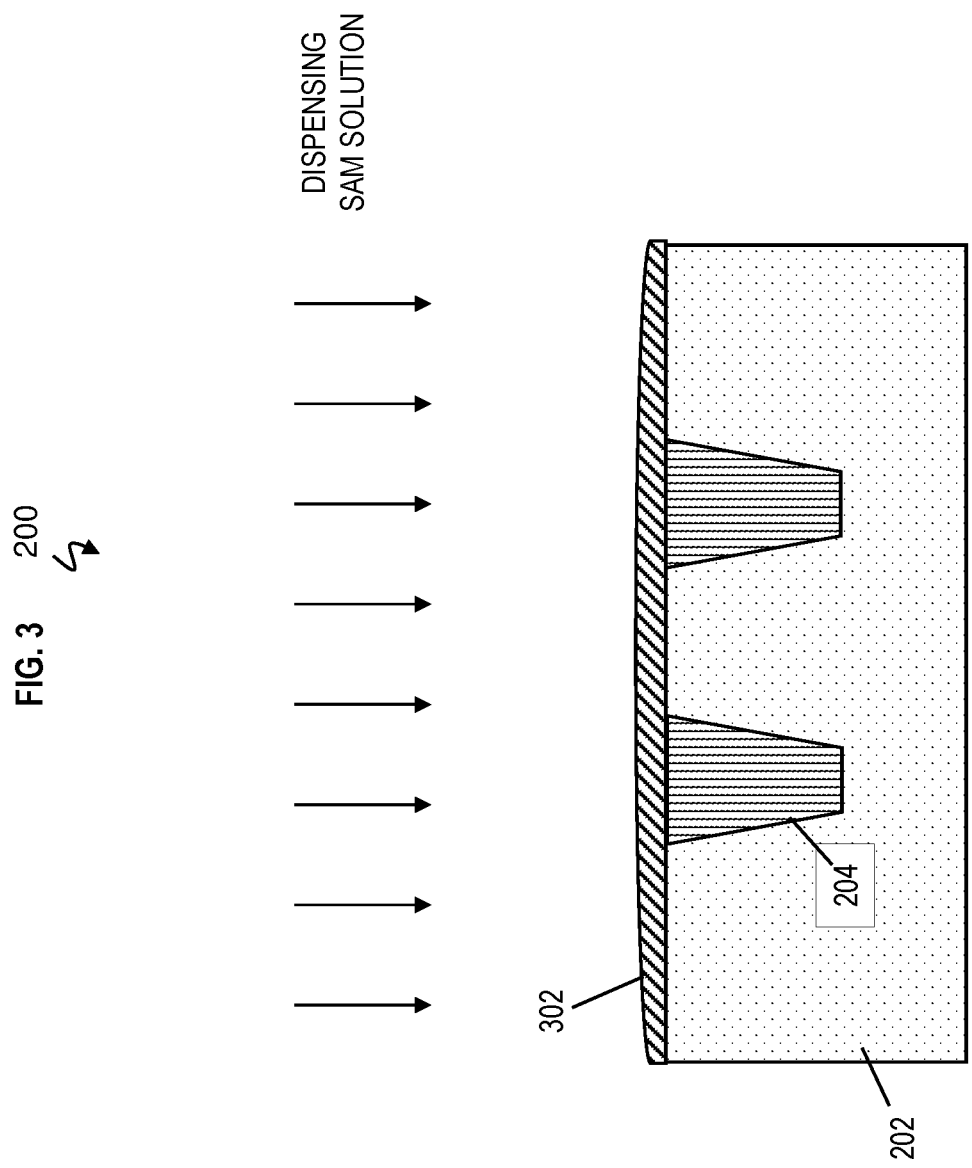
FIG. 3 depicts a cross-sectional view of a portion of an IC under-fabrication after fabrication operations according to one or more embodiments of the invention.

At block 104, SAM molecules 302 are puddled on the top surface of the IC 200 for a time period as depicted in FIG. 3. During puddle development, one or more nozzles can spray or dispense a SAM solution including SAM molecules 302 in a solvent onto the top surface of the IC 200, and the wafer is slowly spun, thereby resulting in the puddle of SAM molecules 302. The SAM deposition method can be applied in a track coating system through a puddle and rinse (discussed further herein) process as understood by one of ordinary skill in the art.

In accordance with one or more embodiments, it was determined that the SAM molecules 302 should puddle on the surface of IC 200 for a time period of 1 minute to become a SAM inhibitor that is suitable to prevent subsequent deposition of dielectric materials on metal material 204. Particularly, SAM molecules 302 can be allowed to puddle for about 1-10 minutes to become a SAM inhibitor in accordance with one or more embodiments.

Further, it was determined that a SAM formulation from a high boiling point solvent makes a stable formulation with no observed precipitation in accordance with one or more embodiments. In other words, no precipitation (i.e., water) developed on the IC 200 after SAM molecules 302 adhered to the surface of metal material 204. A high boiling point solvent may have a boiling point that ranges from about 131° Celsius (C) to about 230° C. In the SAM solution, examples of high boiling point solvents that can have the SAM molecules 302 can be selected from gamma-butyrolactone (GBL), n-butyl acetate (NBA), propylene glycol monomethyl ether (PGMA), 4-methyl-2-pentanol (4M2P) having a boiling point of 131.6° C., n-methylpyrollidone having a boiling point of 202° C., and didrolevoglucosenone (e.g., Cyrene®) having a boiling point of 227° C. According to one or more embodiments, it was determined that 4M2P solvent works beneficially (or better) with SAM molecules 302 such that SAM molecules 302 adhere well to metal material 204 without precipitation, thereby allowing SAM molecules 302 to be a SAM inhibitor.

Examples of SAM molecules 302 may include examples structures illustrated in FIG. 13. The SAM formulation may include additives that improve solution stability and/or continue to clean surface after the SAM molecule is deposited. Example properties the additives may provide include the following: lowering surface tension, reducing pullback of solvent when on wafer surface and cleaning surface, and/or maintaining a clean surface during SAM deposition. Example compositions of the additive may include the following: citric acid, nonionic surfactants (Neodol 25-3A, ethoxylated alcohols), etc.

According to one or more embodiments, the SAM molecules 302 can be 0.1 weight (wt.) percent (%) of the total SAM solution that contains the solvent (e.g., 4M2P), and this weight percent was found to work particularly well to ensure that the SAM molecules 302 adhere to metal material 204. In one or more embodiments, the SAM molecules 302 can have about a 0.05-0.5 wt. % of the total SAM solution. As noted herein, the SAM solution contains the high boiling point solvent and the SAM molecules 302 and may optionally contain additives to promote desired properties. In one or more embodiments, 1 gram (g) of SAM molecules 302 can be diluted in 1 liter (L) of solvent. The SAM solution (including SAM molecules 302 in the solvent) can be filtered using membrane filters. Example membrane filters may include polytetrafluoroethylene (PTFE) filters, although other suitable membrane filters can be utilized. The SAM solution can be filtered using the PTFE membrane filter with pore diameters of about 0.1 microns (μm) for a first filtration, and then proceed to a second filtration using a PTFE membrane filter with pore diameters of about 0.03 μm. The first and second filtrations reduce particle defects at the surface of metal material 204. In one or more embodiments, the first filtration can have a membrane filter with pore diameters ranging from about 0.1-1 μm. In one or more embodiments, the second filtration can have a membrane filter with pore diameters ranging from about 30-40 nanometers (nm). Subsequent to the second filtration, there can be a third filtration with a membrane filter having a pore diameter of about 10 nm, in or more embodiments.

Figure 4:
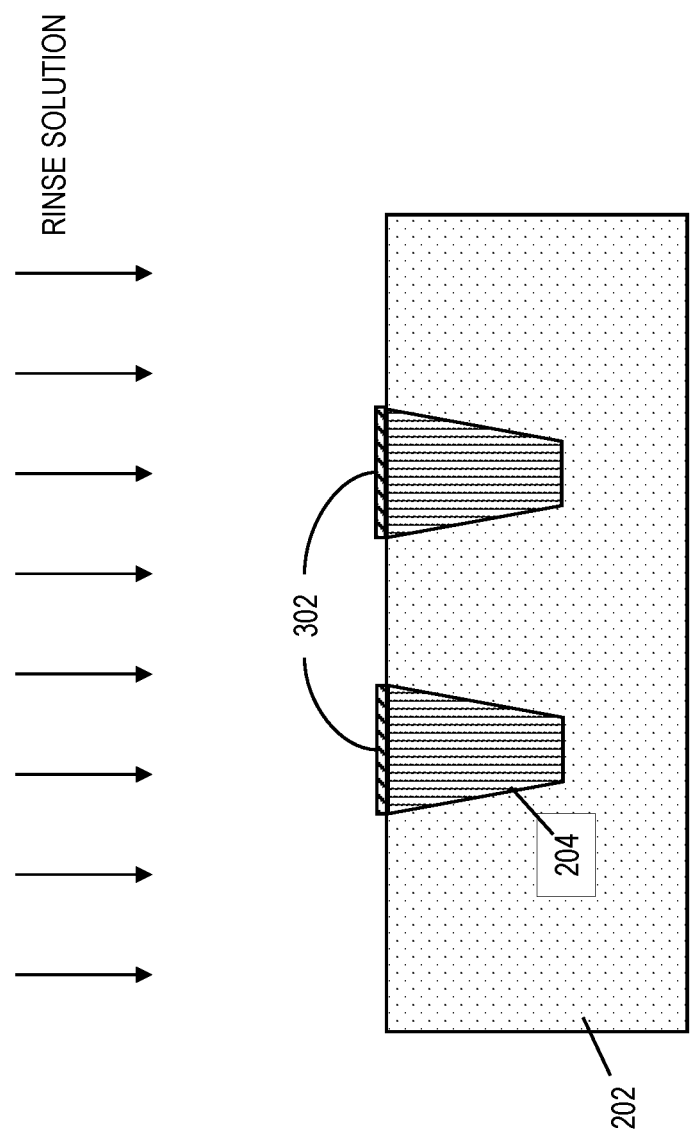
FIG. 4 depicts a cross-sectional view of a portion of an IC under-fabrication after fabrication operations according to one or more embodiments of the invention.

At block 106, a SAM rinse is performed to remove SAM molecules 302 from the dielectric layer 202 as depicted in FIG. 4. The rinse solution can include any of the same solvents previously used with the SAM molecules 302 in the SAM solution discussed above. For example, solvents for the rinse solution can be selected from GBL, NBA, PGMA, 4M2P, n-methylpyrollidone, and didrolevoglucosenone. The rinse can be a solvent flood water rinse, with a large volume dispense. The rinse solvent excludes methanol and isopropyl.

Figure 5:
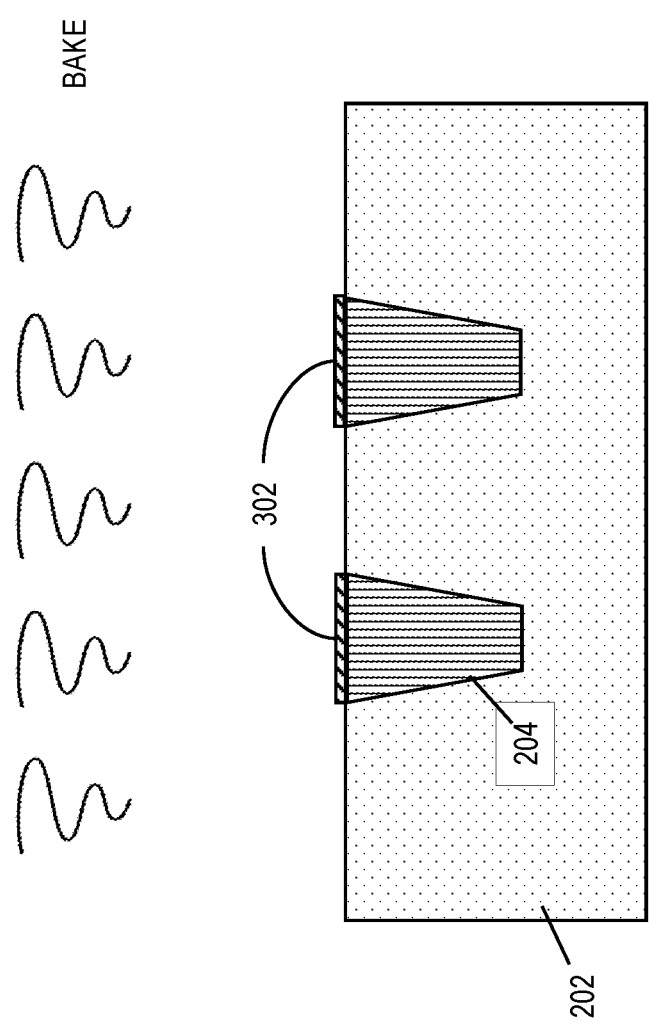
FIG. 5 depicts a cross-sectional view of a portion of an IC under-fabrication after fabrication operations according to one or more embodiments of the invention.

At block 108, optionally a post bake process can be applied to the IC 200 as depicted in FIG. 5. For example, the IC 200 can be baked at a temperature of about 120° Celsius (C) under nitrogen for about 3-4 minutes. Baking under nitrogen prevents the SAM molecules 302 from degrading.

Optionally, any of the blocks 104, 106, 108 of method 100 can be repeated including the SAM puddle, the rinse, and the bake for increased inhibition as desired, which may be dependent on the desired film composition to be deposited.

Figure 6:
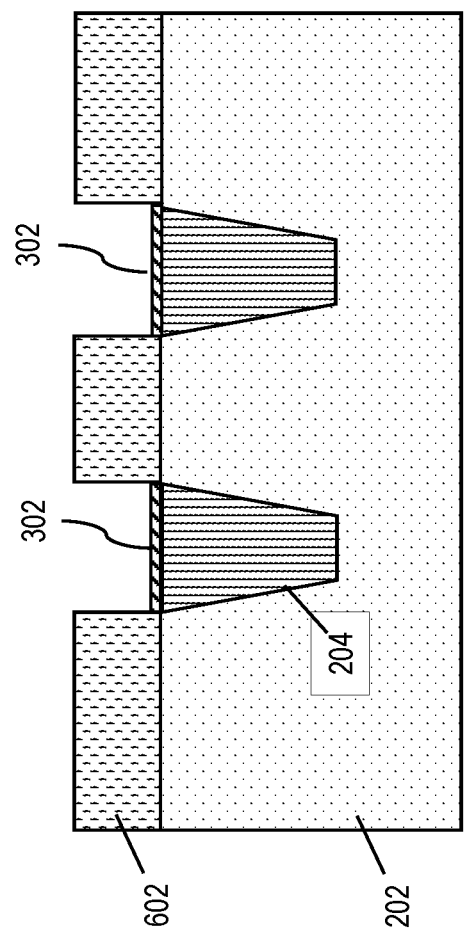
FIG. 6 depicts a cross-sectional view of a portion of an IC under-fabrication after fabrication operations according to one or more embodiments of the invention.

At block 110, area selective deposition is performed on the IC 200 as depicted in FIG. 6. A subsequent dielectric layer 602 is deposited on the IC 200 by a conformal deposition process such as, for example, chemical vapor deposition (CVD), atomic layer deposition (ALD), etc. The subsequent dielectric layer 602 is deposited on dielectric layer 202 but does not form on SAM molecules 302 covering metal material 204. In other words, SAM molecules 302 inhibit the deposition of dielectric layer 202 on metal material 204. The subsequent dielectric layer 602 may include oxides, nitrides, metal oxides, etc. Example materials of the subsequent dielectric layer 602 may include zinc oxide, aluminum oxide, titanium oxide, hafnium oxide, SiCOH, SiCN, and other dielectric compositions.

Figure 7:
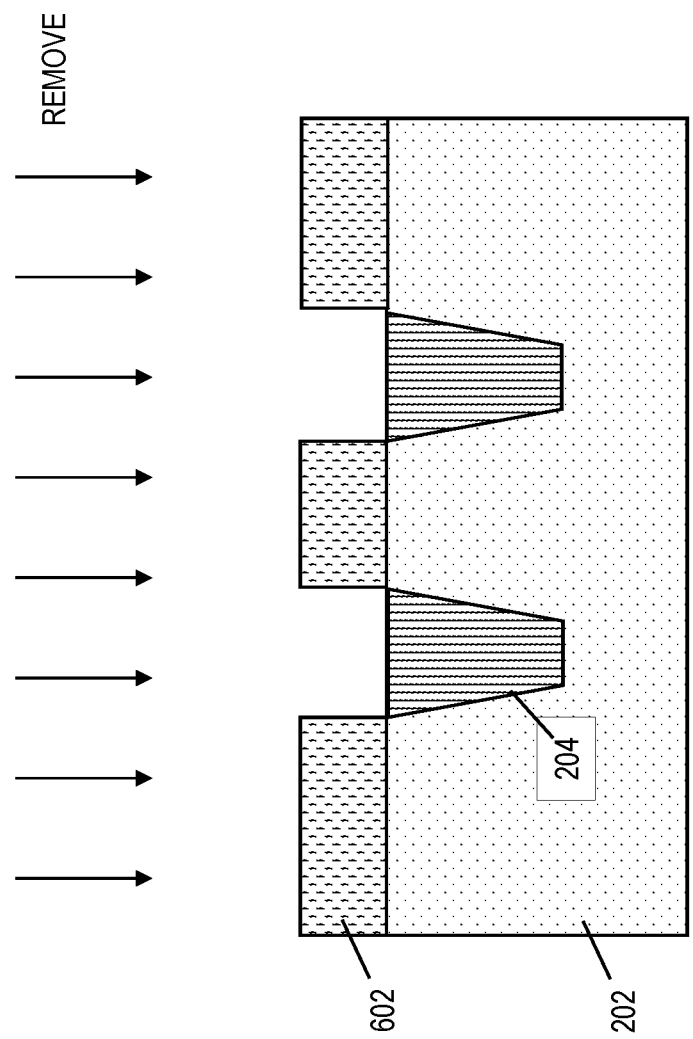
FIG. 7 depicts a cross-sectional view of a portion of an IC under-fabrication after fabrication operations according to one or more embodiments of the invention.
Figure 8:
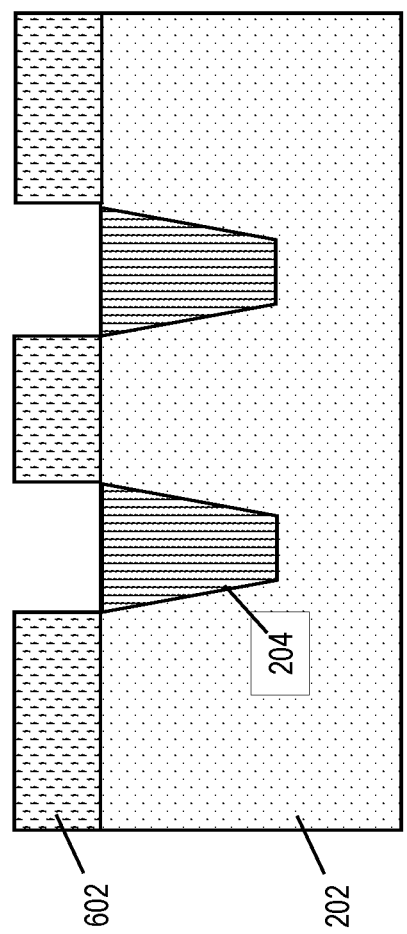
FIG. 8 depicts a cross-sectional view of a portion of an IC under-fabrication after fabrication operations according to one or more embodiments of the invention.

At block 112, a plasma etch process can be performed to remove the SAM molecules 302 from the top of metal material 204 as depicted in FIG. 7, thereby resulting in the IC 200 with the subsequent dielectric layer 602 formed on dielectric layer 202 and with metal material 204 free of both SAM molecules 302 and subsequent dielectric layer 602 as depicted in FIG. 8. The plasma etch can be a hydrogen-based plasma etch analogous to the earlier clean. The plasma etch could use a fluorine-based plasma. If the purpose is to create an oxide layer on top of the metal material 204, a nitrogen oxygen based plasma could be utilized to remove SAM molecules 302.

Figure 9:
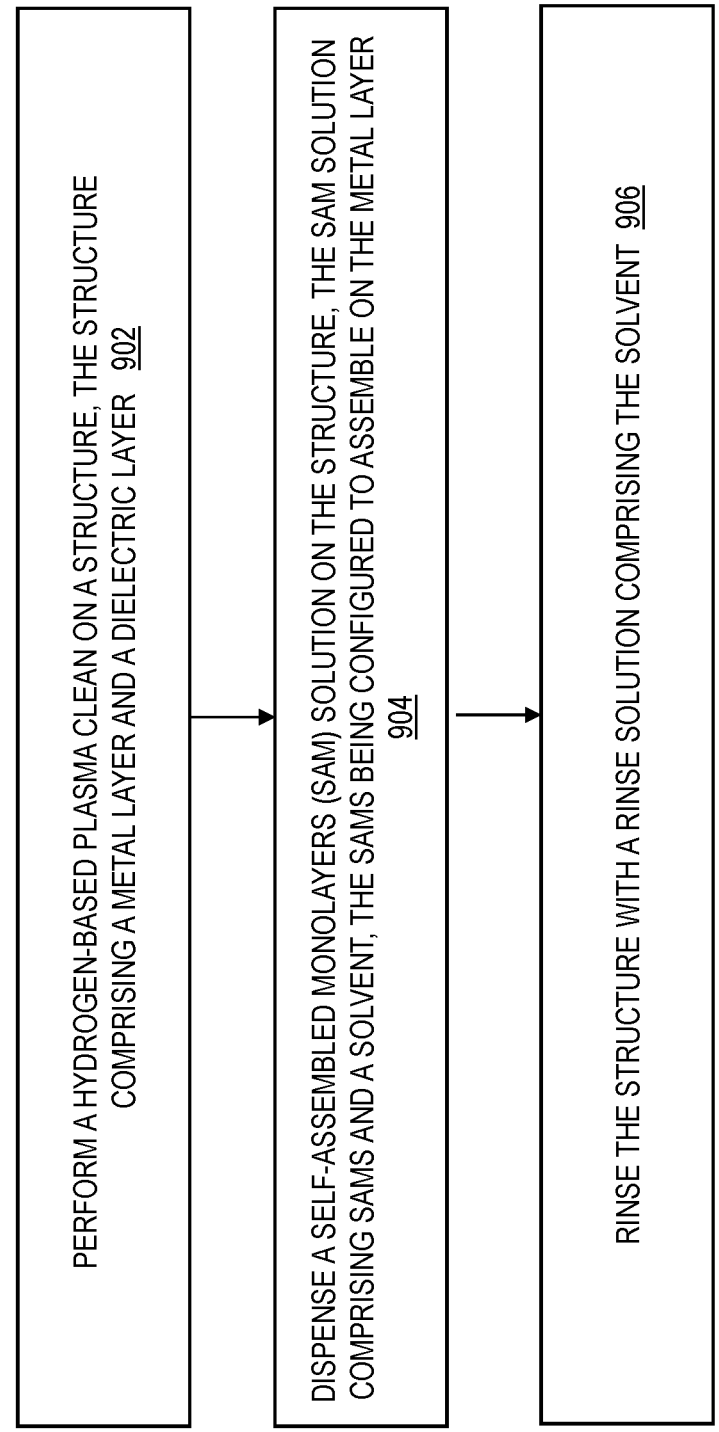
FIG. 9 is a flowchart of a method of implementing SAM formulations and cleaning to promote quick depositions for a structure according to one or more embodiments of the invention.

FIG. 9 is a flowchart of a method 900 for implementing SAM formulations and cleaning to promote quick depositions on a structure (e.g., IC 200) according to one or more embodiments of the invention. Reference can made where appropriate to FIGS. 1-8.

At block 902, the method 900 includes performing a hydrogen-based plasma clean on a structure (e.g., IC 200), the structure comprising a metal layer (e.g., metal material 204) and a dielectric layer 202. At block 904, the method 900 includes dispensing a self-assembled monolayers (SAM) solution on the structure, the SAM solution comprising SAMs (e.g., SAM molecules 302) and a solvent, the SAMs (e.g., SAM molecules 302) being configured to assemble on the metal layer (e.g., metal material 204). At block 906, the method 900 includes rinsing the structure (e.g., IC 200) with a rinse solution comprising the solvent.

The structure (e.g., IC 200) is baked in a gas. The structure is baked in a gas comprising nitrogen. The structure is baked in a gas, the gas excluding oxygen. The solvent is a high boiling point solvent, the high boiling point solvent boils at about 131° Celsius (C) to about 230° C. The SAMs (e.g., SAM molecules 302) remain on the metal layer (e.g., metal material 204) and are rinsed from the dielectric layer 202. A material (e.g., subsequent dielectric layer 602) is deposited on the dielectric layer 202, while the SAMs (e.g., SAM molecules 302) prevent the material from being deposited on the metal layer (e.g., metal material 204). The SAMs (e.g., SAM molecules 302) are removed from the metal layer (e.g., metal material 204). The solvent is selected from the group consisting of gamma-butyrolactone, n-butyl acetate, propylene glycol monomethyl ether, and 4-methyl-2-pentanol. The solvent comprises a boiling point such that the solvent prevents the structure (e.g., IC 200) from precipitating subsequent to the rising in FIG. 4. The rinse solution comprises the solvent previously used in the SAM solution. The method includes performing a first filtering of the SAM solution using a first filter comprising a first pore size, and performing a second filtering of the SAM solution using a second filter comprising a second pore size smaller than the first pore size, responsive to the first filtering.

Figure 10:
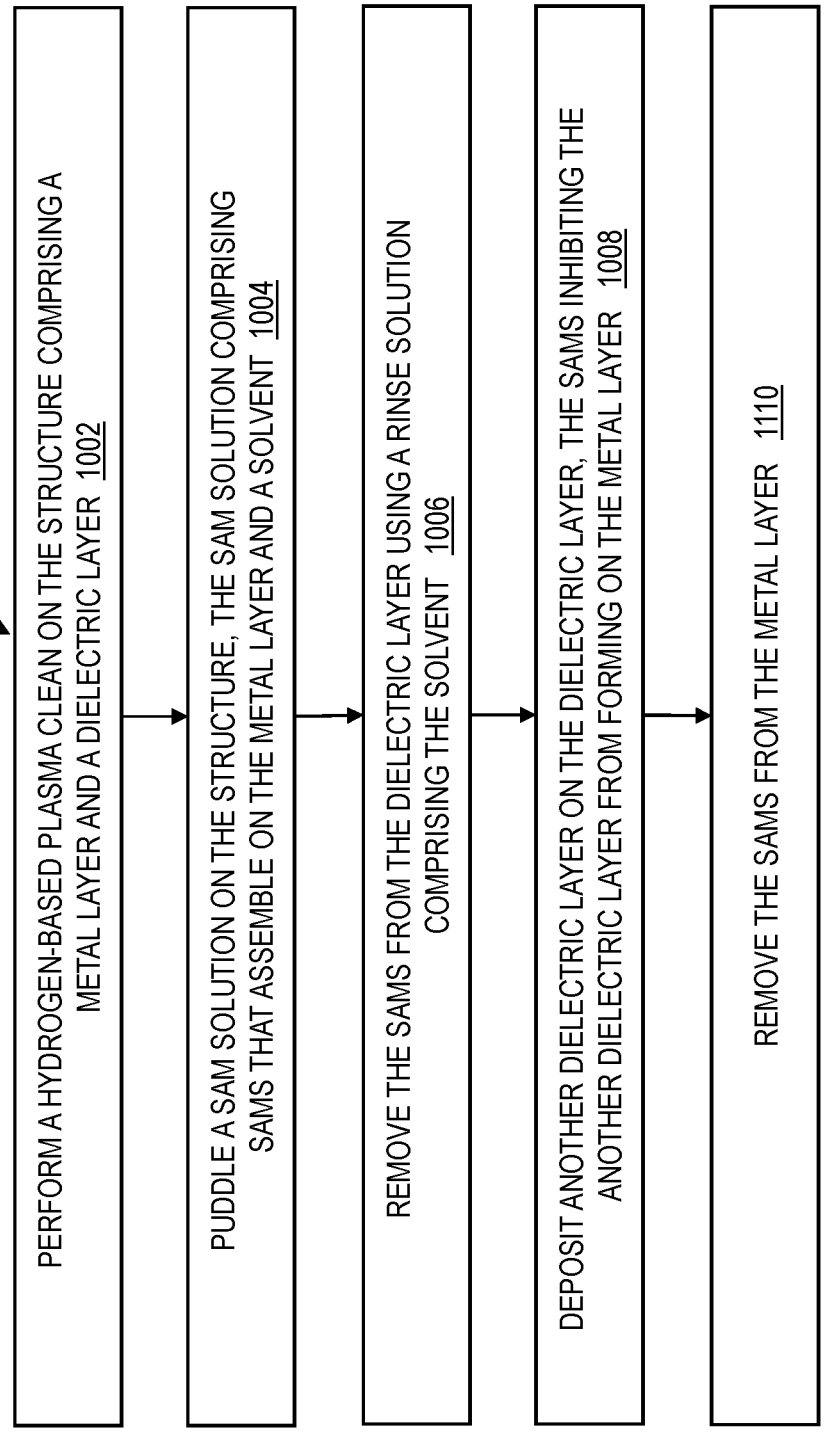
FIG. 10 is a flowchart of a method for forming a structure using SAM formulations and cleaning to promote quick depositions according to one or more embodiments of the invention.

FIG. 10 is a flowchart of a method 900 of forming a structure (e.g., IC 200) using SAM formulations and cleaning to promote quick depositions according to one or more embodiments of the invention. Reference can made where appropriate to FIGS. 1-9. At block 1002, the method 1000 includes performing a hydrogen-based plasma clean on the structure (e.g., IC 200) comprising a metal layer (e.g., metal material 204) and a dielectric layer 202. At block 1004, the method 1000 includes puddling (not immersing) a SAM solution on the structure (e.g., IC 200), the SAM solution comprising SAMs (e.g., SAM molecules 302) that assemble on the metal layer (e.g., metal material 204) and a solvent. At block 1006, the method 1000 includes removing the SAMs (e.g., SAM molecules 302) from the dielectric layer 202 using a rinse solution comprising the solvent. At block 1008, the method 1000 includes depositing another dielectric layer 602 on the dielectric layer 202, the SAMs (e.g., SAM molecules 302) inhibiting the another dielectric layer 602 from forming on the metal layer (e.g., metal material 204). At block 1010, the method 1000 includes removing the SAMs (e.g., SAM molecules 302) from the metal layer (e.g., metal material 204).

Figure 11:
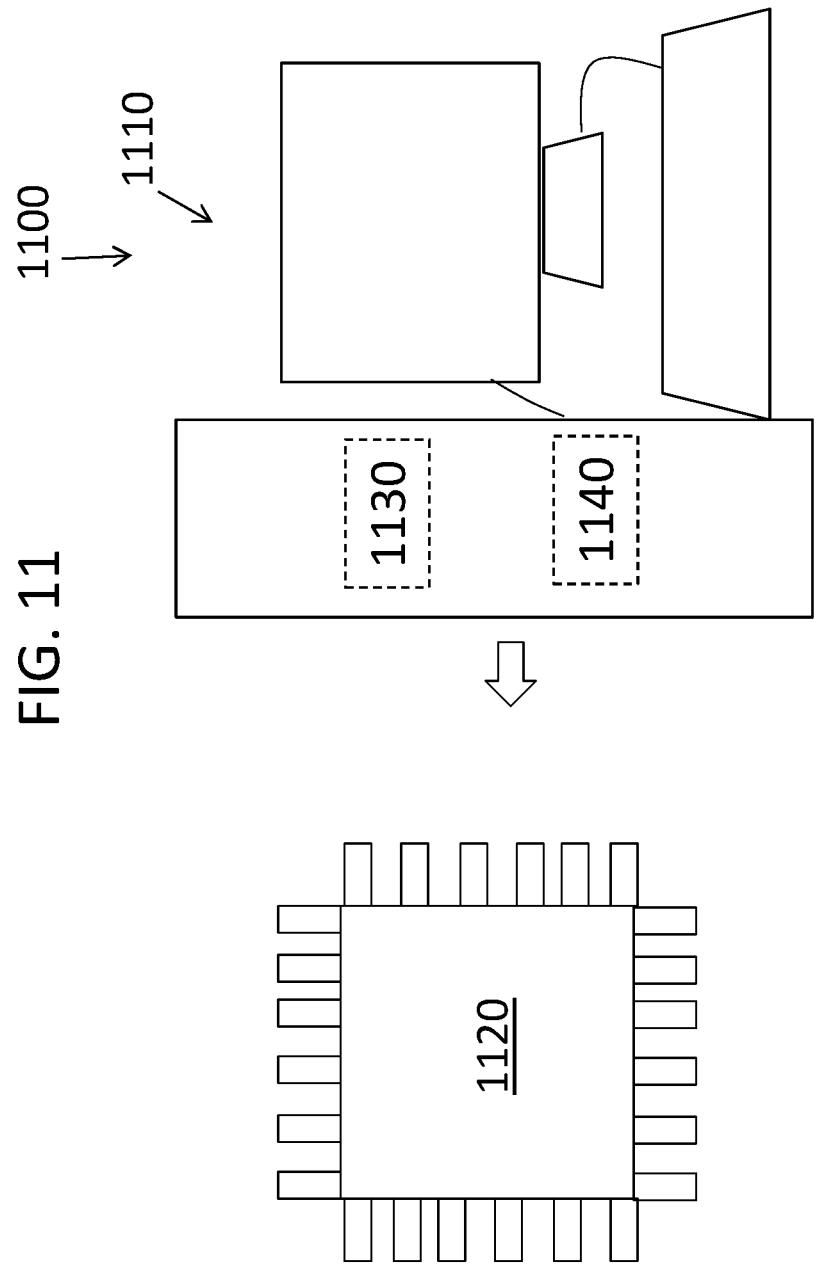
FIG. 11 is a block diagram of a system to design/layout a portion of an IC in accordance with one or more embodiments of the present invention.

FIG. 11 is a block diagram of a system 1100 according to embodiments of the invention. The system 1100 includes processing circuitry 1110 used to generate the design 1130 that is ultimately fabricated into an integrated circuit 1120, which can include a variety of active semiconductor devices. The steps involved in the fabrication of the integrated circuit 1120 are well-known and briefly described herein. Once the physical layout 1140 is finalized, based, in part, on IC 200 using self-assembled monolayers (SAM) formulations and cleaning to promote quick depositions according to embodiments of the invention, the finalized physical layout 1140 is provided to a foundry. Masks are generated for each layer of the integrated circuit based on the finalized physical layout. Then, the wafer is processed in the sequence of the mask order. The processing includes photolithography and etch. This is further discussed with reference to FIG. 12.

Figure 12:
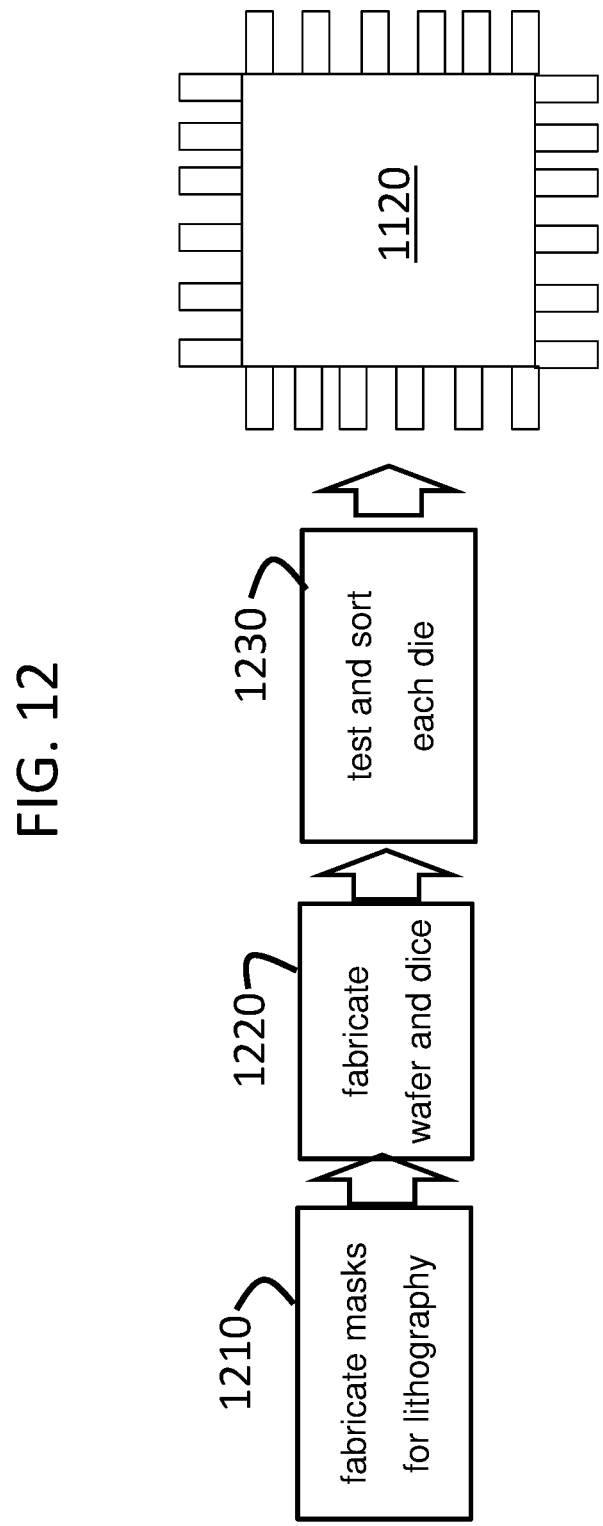
FIG. 12 is a process flow of a method of fabricating the IC of FIG. 11 in accordance with one or more embodiments of the present invention.

FIG. 12 is a process flow of a method of fabricating the integrated circuit according to exemplary embodiments of the invention. Once the physical design data is obtained, based, in part, IC 200, the integrated circuit 1120 can be fabricated according to known processes that are generally described with reference to FIG. 12. Generally, a wafer with multiple copies of the final design is fabricated and cut (i.e., diced) such that each die is one copy of the integrated circuit 1120. At block 1210, the processes include fabricating masks for lithography based on the finalized physical layout. At block 1220, fabricating the wafer includes using the masks to perform photolithography and etching. Once the wafer is diced, testing and sorting each die is performed, at block 1230, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a" "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    performing a hydrogen-based plasma clean on both a metal layer and a dielectric layer of a structure;
    in response to performing the hydrogen-based plasma clean on both the metal layer and the dielectric layer, dispensing a self-assembled monolayers (SAM) solution on the structure to puddle for about 1 minute prior to rinsing with a rinse solution and prior to baking, the SAM solution comprising SAMs and a solvent, the SAMs being configured to assemble on the metal layer, wherein the solvent of the SAM solution comprises didrolevoglucosenone;
    rinsing the structure with the rinse solution comprising the solvent having the didrolevoglucosenone; and
    in response to the SAMs having remained on the structure for about 1 minute prior to the rinsing the rinse solution and prior to baking, baking the structure in a gas.

2. The method of claim 1, further comprising:
    baking the structure in the gas comprising nitrogen.

3. The method of claim 1, wherein the gas excludes oxygen.

4. The method of claim 1, wherein the solvent is a high boiling point solvent, the high boiling point solvent boils at about 131° Celsius (C) to about 230° C.

5. The method of claim 1, wherein the SAMs remain on the metal layer and are rinsed from the dielectric layer.

6. The method of claim 1 further comprising:
    depositing a material on the dielectric layer, while the SAMs prevent the material from being deposited on the metal layer.

7. The method of claim 1, wherein the SAMs are removed from the metal layer.

8. The method of claim 1, wherein the solvent comprises a boiling point such that the solvent prevents the structure from precipitating subsequent to the rising.

9. The method of claim 1, further comprising:
    performing a first filtering of the SAM solution using a first filter comprising a first pore size; and
    performing a second filtering of the SAM solution using a second filter comprising a second pore size smaller than the first pore size, responsive to the first filtering.

10. A method of forming a structure, the method comprising:
    performing a hydrogen-based plasma clean on both a metal layer and a dielectric layer of the structure;
    in response to performing the hydrogen-based plasma clean on both the metal layer and the dielectric layer, puddling a SAM solution on the structure for about 1 minute prior to rinsing with a rinse solution and prior to baking, the SAM solution comprising SAMs that assemble on the metal layer and a solvent, wherein the solvent of the SAM solution is selected from the following comprising 4-methyl-2-pentanol, gamma-butyrolactone, n-butyl acetate, n-methylpyrollidone, and didrolevoglucosenone;
    in response to the SAMs having remained on the structure for about 1 minute prior to the rinsing the rinse solution and prior to baking, baking the structure in a gas;
    removing the SAMs from the dielectric layer using the rinse solution comprising the solvent;
    depositing another dielectric layer on the dielectric layer, the SAMs inhibiting the another dielectric layer from forming on the metal layer; and
    removing the SAMs from the metal layer.

11. The method of claim 10, further comprising:
    baking the structure in the gas prior to depositing the another dielectric layer.

12. The method of claim 10, further comprising:
    baking the structure in the gas comprising nitrogen.

13. The method of claim 10, wherein the gas excludes oxygen.

14. The method of claim 10, wherein the solvent is a high boiling point solvent, the high boiling point solvent boils at about 131° C. to about 230° C.

15. The method of claim 10, wherein the SAMs remain on the metal layer subsequent to removing the SAMs from the dielectric layer.

16. The method of claim 10, wherein the solvent for rinsing excludes methanol and isopropyl.

17. The method of claim 10, further comprising:
    performing a first filtering of the SAM solution using a first filter comprising a first pore size; and
    performing a second filtering of the SAM solution using a second filter comprising a second pore size smaller than the first pore size, responsive to the first filtering.

* * * * *